United States Patent [19]
Yoshida et al.

[11] Patent Number: 5,372,089
[45] Date of Patent: Dec. 13, 1994

[54] METHOD OF FORMING SINGLE-CRYSTALLINE THIN FILM

[75] Inventors: Noriyuki Yoshida; Satoshi Takano; Kousou Fujino; Shigeru Okuda, all of Osaka; Tsukushi Hara; Hideo Ishii, both of Chofu, all of Japan

[73] Assignees: Sumitomo Electric Industries, Ltd., Osaka; The Tokyo Electric Power Company Incorporated, Tokyo, both of Japan

[21] Appl. No.: 97,788

[22] Filed: Jul. 26, 1993

[30] Foreign Application Priority Data

Jul. 30, 1992 [JP] Japan .................................. 4-203858
May 13, 1993 [JP] Japan .................................. 5-111488
May 19, 1993 [JP] Japan .................................. 5-117203

[51] Int. Cl.$^5$ ........................ C30B 25/02; H01L 39/24
[52] U.S. Cl. ........................... 117/98; 505/434; 505/430; 505/474; 505/729; 505/730; 505/732; 427/62; 427/596
[58] Field of Search .................. 505/1, 729, 704, 730, 505/732, 430, 434, 474; 427/62, 63, 596; 156/610; 117/98

[56] References Cited

U.S. PATENT DOCUMENTS 5,206,216 4/1993 Yoshida .................................. 505/1

FOREIGN PATENT DOCUMENTS 0499982 8/1992 European Pat. Off. ..... C30B 25/02

OTHER PUBLICATIONS

Patent Abstracts of Japan; vol. 15, No. 96 (C-812) 7 Mar. 1991.
Patent Abstracts of Japan, vol. 16, No. 95 (E-1175) 9 Mar. 1992.
Patent Abstracts of Japan, vol. 16, No. 48 (E-1163) 6 Feb. 1992.

Primary Examiner—Roy V. King
Attorney, Agent, or Firm—Pennie & Edmonds

[57] ABSTRACT

Disclosed herein is a method of forming a single-crystalline thin film having excellent crystallinity on a base material without depending on the material for and crystallinity of the base material. In this method, a base material is provided thereon with a mask which can prevent chemical species contained in a vapor phase from adhering to the base material. The base material is continuously moved along arrow A, to deliver a portion covered with the mask into the vapor phase for crystal growth. Thus, a thin film is successively deposited on the portion of the base material, which is delivered from under the mask, from the vapor phase. A crystal growth end is formed on a boundary region between a portion of the base material which is covered with the mask and that which is exposed to the vapor phase, so that a crystal having the same orientation as the growth end is grown on a portion of the base material newly exposed by the movement.

23 Claims, 8 Drawing Sheets

METHOD OF FORMING SINGLE-CRYSTALLINE THIN FILM

BACKGROUND OF THE INVENTION

1. Field of the Invention

The present invention relates to a method of forming a single-crystalline thin film on a base material, and more particularly, it relates to a method for forming a single-crystalline thin film consisting essentially of an oxide superconductor on an arbitrary base material. Throughout the specification, the term "single-crystalline" means a dominative state of a crystal having a specific orientation. This term is applied not only to a single crystal having only a specific orientation but to a crystalline solid containing a mixture of crystals having different orientations with a dominative state of a crystal having a specific orientation.

2. Description of the Background Art

In a technique of fabricating a semiconductor device, various methods such as liquid phase epitaxy (LPE), organometallic chemical vapor deposition (MOCVD), molecular beam epitaxy (MBE) and ion beam epitaxy (IBE) are employed as methods of forming thin films of semiconductor single crystals. These methods, which are capable of forming high quality single-crystalline thin films, are indispensable techniques for fabrication of a semiconductor device.

In the field of superconduction, methods of forming single-crystalline thin films have been studied since discovery of Y, Bi and Tl oxide superconducting materials having critical temperatures of 90 K., 108 K. and 125 K. which are higher than the liquid nitrogen temperature of 77.3 K., in order to apply these materials to electronic devices. It has been found that methods such as laser vapor deposition, reactive vapor deposition and the like are effective for forming high quality single-crystalline thin films with respect to such oxide superconducting materials.

The aforementioned conventional methods of forming single-crystalline thin films utilizing epitaxy, i.e., such a phenomenon that another type of crystal is grown on a specific crystal plane in a constant orientational relation, are generally adapted to form thin films on surfaces of single-crystalline substrates. In each of such conventional methods, it is extremely important to employ a single-crystalline substrate having a crystal structure and a lattice constant which are similar and close to those of the thin film material, in order to form a high quality single-crystalline thin film. In such prior art, therefore, a single-crystalline thin film can be formed only on a substrate which is made of a specific material, while the size of the formable single-crystalline thin film depends on that of the employable substrate. Thus, it is impossible to freely form a single-crystalline thin film having desired size and length according to the prior art.

In the field of a semiconductor thin film, on the other hand, there is graphoepitaxy of employing an amorphous substrate having periodic grooves formed on its surface and generating crystal nuclei on edges of these grooves in a selective orientation, thereby single-crystallizing a film deposited on the substrate. According to this technique, it is possible to form a single-crystalline thin film having excellent crystallinity as to Si, for example, without employing a single-crystalline substrate. Also in such graphoepitaxy, however, the size of the substrate which can be provided with periodic grooves is restricted. Thus, it is difficult to freely form a single-crystalline thin film on a base material having desired size and length, similarly to the above.

In recent years, there has been made an attempt of forming an oxide superconducting film on a flexible long tape base material for manufacturing a superconducting wire. The base material for the wire is generally prepared from a metal, which is a polycrystalline substance in general. When an oxide thin film is formed on such a base material by laser vapor deposition or reactive vapor deposition, generally formed is a polycrystalline or amorphous thin film having random orientation. Even if the thin film has natural orientations, crystals forming the thin film orient specific crystal axes in a direction perpendicular to the surface of the base material, while hardly orienting axes in a direction parallel to the base material surface. Also when an oxide superconductor film is formed on a polycrystalline substrate of MgO, $SrTiO_3$ or $ZrO_2$, the as-formed film has irregularly oriented crystal planes. Since a superconducting current is inhibited by grain boundaries, it is impossible to attain sufficient superconductivity in a thin film which is formed on a polycrystalline substrate by the prior art.

SUMMARY OF THE INVENTION

An object of the present invention is to provide a method which can form a single-crystalline thin film having excellent crystallinity on a base material without depending on a material for and crystallinity of the base material.

Another object of the present invention is to provide a method which can arbitrarily form a single-crystalline thin film having excellent crystallinity on a base material of a desired size.

Still another object of the present invention is to form an oxide superconducting thin film having excellent crystallinity and superconductivity on a polycrystalline base material.

A further object of the present invention is to form an oxide superconducting thin film having excellent crystallinity and superconductivity on a long base material, thereby fabricating a wire which exhibits a high critical current density.

Provided according to the present invention is a method for forming a single-crystalline thin film which is mainly formed of a crystal having a specific orientation, more preferably a thin film of a single crystal, on a continuous region of a base material from a vapor phase. This method comprises a step of preparing a base material to be provided thereon with a thin film, a step of preparing a vapor phase for depositing a crystal on the base material, a step of covering the base material with a mask which can prevent chemical species contained in the vapor phase from adhering to the base material, and a step of relatively moving the base material with respect to the mask thereby continuously delivering a portion of the base material having been covered with the mask into the vapor phase.

The present invention is adapted to form a single-crystalline thin film consisting essentially of an oxide superconductor, more preferably a thin film of a single crystal, on a base material, in particular. The oxide superconductor includes a Y-based superconductor such as a Y-Ba-Cu-O superconductor, a Bi-based superconductor such as a Bi-Sr-Ca-Cu-O superconductor, or a Tl-based superconductor such as a Tl-Bi-Sr-Ca-Cu-O superconductor. The vapor phase for depositing the oxide superconductor can be prepared in accordance with vapor deposition such as reactive vapor deposition, laser ablation, molecular beam epitaxy (MBE), CVD, ion plating, spray pyrolysis, flash plasma or the like. When laser ablation is employed, it is possible to form a single-crystalline thin film of a superconductor by irradiating a target of a Y, Bi or Tl have sintered body with a laser beam for generating plasma and exposing a base material delivered from the mask to this plasma. A substrate for forming a thin film of an oxide superconducting material has been generally prepared from a single crystal of MgO, $SrTiO_3$ or $ZrO_2$. According to the present invention, however, a base material can be prepared from a polycrystalline material of MgO, $SrTiO_3$ or $ZrO_2$, a sheet of yttria stabilized zirconia, or a metal base material such as a metal tape, in addition to the said material.

The present invention is applied to formation of a single-crystalline thin film on a polycrystalline substrate, in particular.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
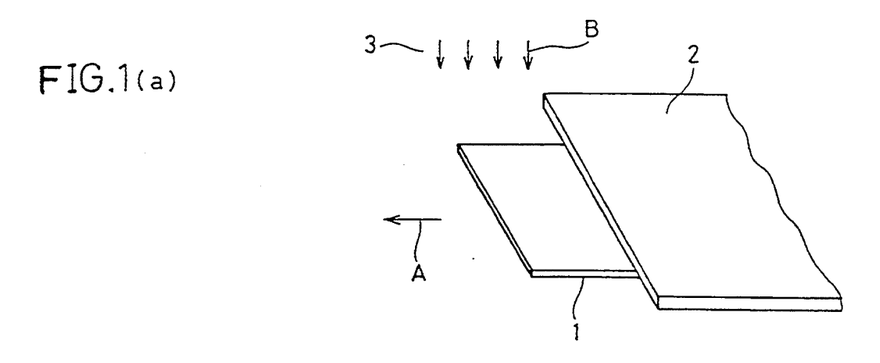
FIGS. 1(a), 1(b) and 1(c) are perspective views typically showing an exemplary process of forming a thin film according to the present invention.
Figure 1B:
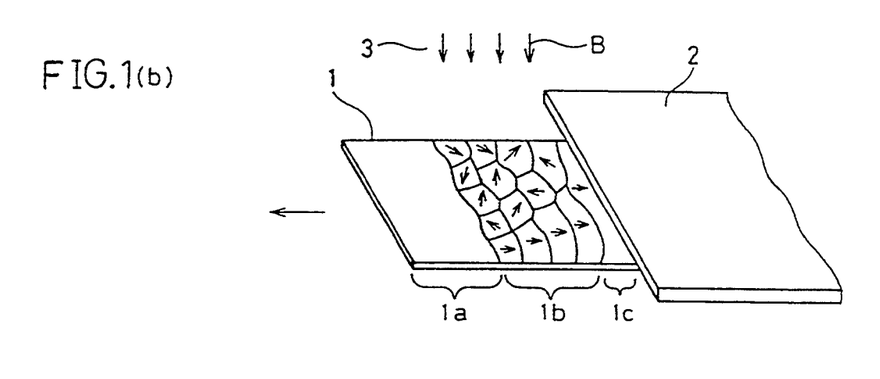
Figure 1C:
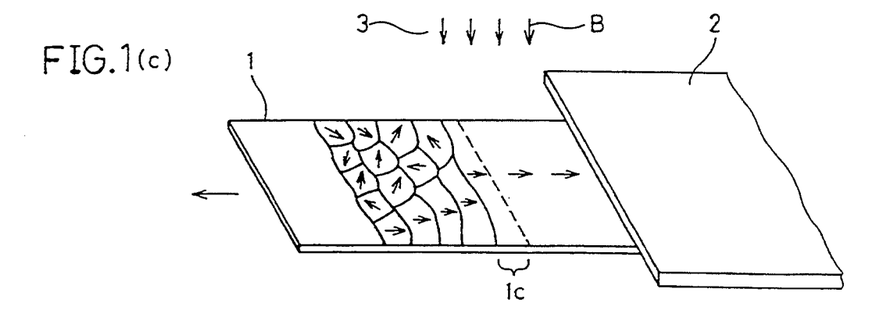

FIGS. 1(a) to 1(c) are perspective views typically showing a process of forming a thin film according to the present invention. According to the present invention, a base material 1 is delivered into a vapor phase 3 for crystal growth from an end thereof through a mask 2. This base material 1 is delivered along arrow A in FIG. 1(a). On the other hand, chemical species contained in the vapor phase 3 are deposited on the base material 1 as shown by arrow B in FIG. 1(a). As shown in this figure, no chemical species contained in the vapor phase 3 adhere to a portion of the base material 1 covered with the mask 2, while the chemical species adhere to a portion delivered into the vapor phase 3 from under the mask 2. Thus, a thin film is continuously formed on the base material 1, which is continuously delivered along arrow A.

Description is now made on a process of forming a single-crystalline thin film by moving the base material 1. For the purpose of illustration, it is assumed that the base material 1 is delivered from such a state that an end thereof is slightly exposed to the vapor phase 3. FIG. 1(b) shows a certain point of time during delivery of the base material 1 from the state shown in FIG. 1(a). A region 1a of the base material 1 has been exposed to the vapor phase 3 in advance of such movement of the base material 1, with no experience of movement from under the mask 2 into the vapor phase 3. In such a region 1a, a thin film formed on the surface of the base material 1 is generally formed by crystals having random orientations or in an amorphous state. Even if the thin film has natural orientation, crystals forming this film orient specific crystal axes in a direction normal to the surface of the base material 1, with less implementation of a specific orientation in parallel with the base material surface. In a moved region between the region 1a and the mask 2, on the other hand, an initial portion 1b is influenced by the unmoved region 1a to form crystals having various orientations. Following the movement, however, a certain specific crystal orientation becomes so dominant as to form a region 1c having a regular orientation. Referring to FIG. 1(b), arrows show a distributed state of crystal orientations, in order to typically illustrate such a state. This is conceivably because a crystal growth end is formed on a boundary region between the portion of the base material 1 which is covered with the mask 2 and that which is exposed to the vapor phase 3, so that a crystal having the same orientation as the growth end is grown on the portion of the base material 1 newly exposed by its movement. When a growth end having a specific crystal orientation can be reliably grown, therefore, it is possible to form a thin film having strong single-crystallinity with no remarkable influence by the material for and the crystal orientation of the base material 1. When the base material 1 is further moved in the aforementioned manner, the crystal having the same orientation as the region 1c is further grown as shown in FIG. 1(c). Once grains having a specific orientation are dominatively formed as hereinabove described, crystal grains having the specific orientation are continuously formed on the base material 1 by continuous movement thereof and an effect of the mask 2, with no regard to the material for and the crystal orientation of the base material 1.

When a tape-type base material is employed in the aforementioned method and moved along its longitudinal direction from one end thereof, for example, it is possible to form a single-crystalline thin film over the longitudinal direction of the base material.

Figure 2:
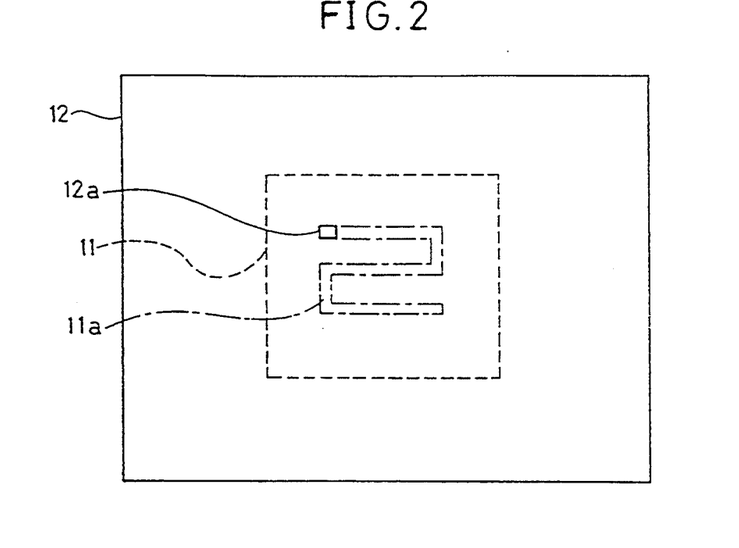
FIG. 2 is a plan view showing another exemplary process of forming a thin film according to the present invention.

When a base material 11 is covered with a mask 12 having a window 12a as shown in FIG. 2 and vapor deposition is carried out from above the window 12a, it is possible to form a thin film only on a portion of the base material 11 located under the window 12a. If the base material 11 or the mask 12 is continuously moved in this state, it is possible to form a thin film on a region 11a (shown by one-dot chain lines in FIG. 2) along which the window 12a is moved. Also in this case, it is possible to form a single-crystalline thin film on the region 11a due to the aforementioned continuous movement and the effect of the mask 12. When such a mask 12 is employed, it is possible to form a single-crystalline thin film on an arbitrary region of the base material 11.

According to the present invention, the base material can be prepared from an arbitrary material in an arbitrary shape. The material and the shape of the base material can be properly determined in response to the application of a substance obtained by forming a single-crystalline thin film, film forming conditions, and the like. The method according to the present invention is applicable to formation of a single-crystalline thin film on a long base material such as a tape-type base material, in particular. According to the present invention, the mask for covering the base material is not restricted so far as the same can prevent chemical species for vapor deposition from adhering to the base material, and the material, the shape etc. thereof may be properly selected in response to the film forming conditions and the like. This mask must be so provided as to effectively prevent chemical species contained in the vapor phase from being scattered on the base material. When the base material is covered with the mask, therefore, it is necessary to prevent molecules, atoms etc. for vapor deposition from entering a clearance between the mask and the base material. To this end, a distance between the base material and the mask is preferably not more than about 3 mm when vapor deposition is employed, although this distance depends on conditions for vapor-phase growth. According to the present invention, the base material is relatively moved with respect to the mask. Namely, the base material is moved when the mask is fixed, and vice versa. Alternatively, both of the mask and the base material can be moved at the same time. In order to form a single-crystalline thin film on a tape-type base material, for example, a mask may be fixed so that the tape-type base material is continuously delivered into a vapor phase for crystal growth through the mask. Since such a tape-type base material can be taken up, it is possible to deliver the tape-type base material from a first reel into a vapor phase for crystal growth through a mask while taking up the same on a second reel, thereby successively forming a single-crystalline thin film on the tape. As hereinabove described, it is also possible to cover a base material with a mask which is provided with a window such as a slit, so that chemical species contained in the vapor phase adhere to the base material through the window. When the base material or the mask is so moved that the window passes through the base material, it is possible to form a single-crystalline thin film on a portion of the base material through which the window has passed.

According to the present invention, an environmental phase for crystal growth is a vapor phase, so that PVD such as sputtering or CVD can be employed for vapor-phase crystal growth. According to the present invention, laser vapor deposition, reactive vapor deposition, organometallic chemical vapor deposition (MOCVD), molecular beam epitaxy (MBE) or ion beam epitaxy (IBE) is preferably employed as a vapor phase growth method, for example.

In a more preferred mode of the present invention, it is possible to form a thin film which is mainly formed of a crystal having a specific orientation on a continuous region of a substrate from a vapor phase which is prepared along laser ablation. In this case, a portion of a base material which is covered with a mask is more preferably delivered at a speed of at least about 1 cm/min. into the environment for crystal growth when the base material is relatively moved with respect to the mask. When an oxide superconductor film is formed, laser ablation can be carried out under conditions of a base material temperature of 650° to 750° C., a gaseous oxygen pressure of 30 to 500 mTorr, a laser beam in a wavelength region of 248 to 1060 nm and a laser energy density of 1.5 to 3.3 J/cm$^2$.

Figure 3:
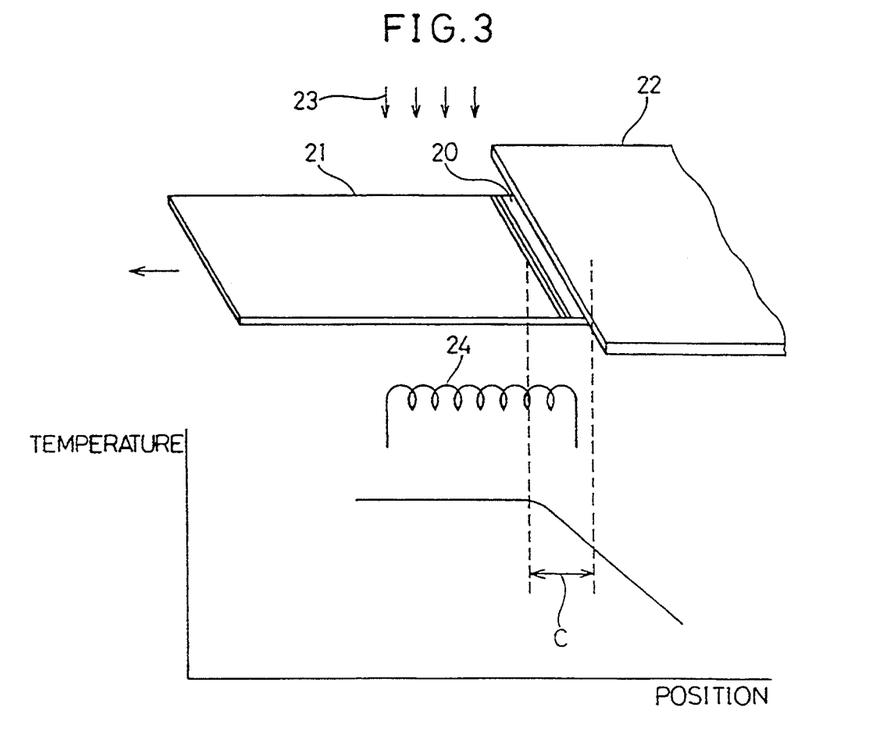
FIG. 3 is a model diagram showing a process of forming a single-crystalline thin film on a base material which is previously provided with a metal thin film according to the present invention.
Figure 4:
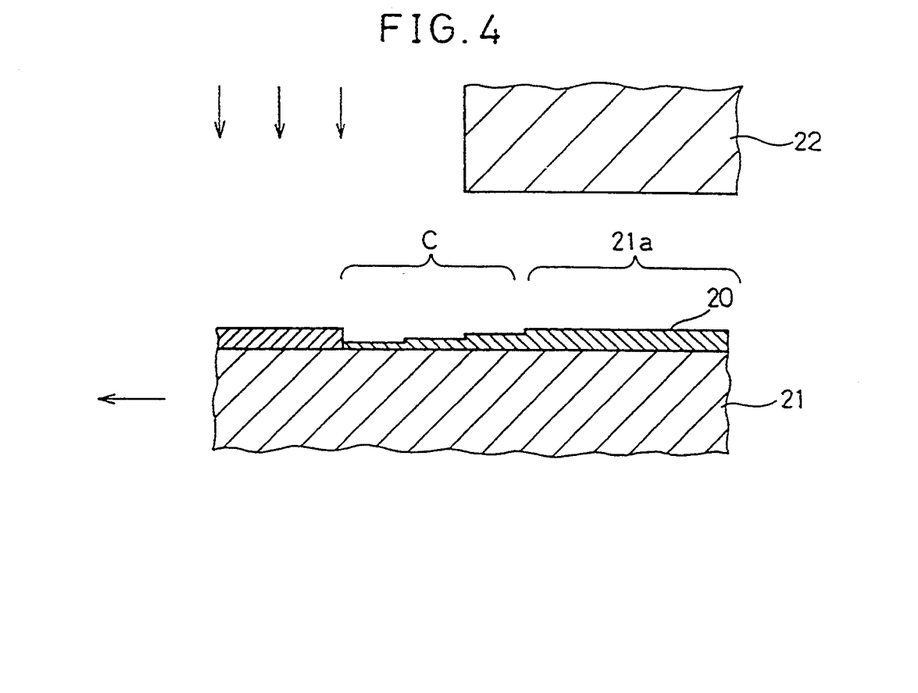
FIG. 4 is a sectional view showing a state of the metal thin film formed on the base material in the process shown in FIG. 3 in an enlarged manner.

In order to control the orientation of a crystal which is formed on a growth end, the following technique is preferably employed:

As shown in FIG. 3, it is possible to form a single-crystalline thin film by employing a base material 21 which is previously provided with a metal thin film 20 and providing a temperature gradient in a boundary region (denoted by C in FIG. 3) between a portion of the base material 21 which is covered with a mask 22 and that which is exposed to a vapor phase 23. The temperature gradient can be set by a heater 24 which is provided under the base material 21, for example. Cooling means may be further provided for temperature control. The metal thin film is made of a material which can be evaporated in the vapor phase. Due to the as-set temperature gradient, the metal thin film has a solid-liquid boundary at the boundary region C. FIG. 4 shows a state of such a solid-liquid boundary in an enlarged manner. As shown in FIG. 4, a portion 21a of the metal thin film 20 covered with the mask 22 is left in a prescribed thickness while another portion located in the boundary region C is melted to form the solid-liquid boundary and the metal forming the thin film 20 is evaporated in this portion from a high temperature part. Consequently, the portion of the metal thin film 20 located in the boundary region C is eroded to exhibit a stepped shape. Such a state can be observed with an electron microscope. When a silver thin film was formed on a base material, for example, it was clarified by observation with an electron microscope that steps were defined in correspondence to a temperature contour line with a height of about 100 Å and a terrace width of about 1000 Å in each step. When a mask is so provided that a film forming region is interrupted, i.e., a crystal growth end is defined in a region provided with such steps, chemical species deposited from the vapor phase generate nuclei with a regular orientation along corners of the steps. When the base material is continuously moved along arrow shown in FIG. 3, steps of the metal thin film are regularly formed in the region provided with the temperature gradient and hence the thin film is grown with a regular orientation along the corners of the steps. Consequently, a single-crystalline thin film is formed in a continuous manner. Such formation of a thin film with a temperature gradient is applicable to a single-crystalline thin film which is formed along a longitudinal direction of a tape-type base material, or a single-crystalline thin film which is provided on an arbitrary region of a base material covered with a mask having a window. In order to form an oxide superconducting thin film, a silver thin film is preferably employed as a metal thin film.

Figure 5:
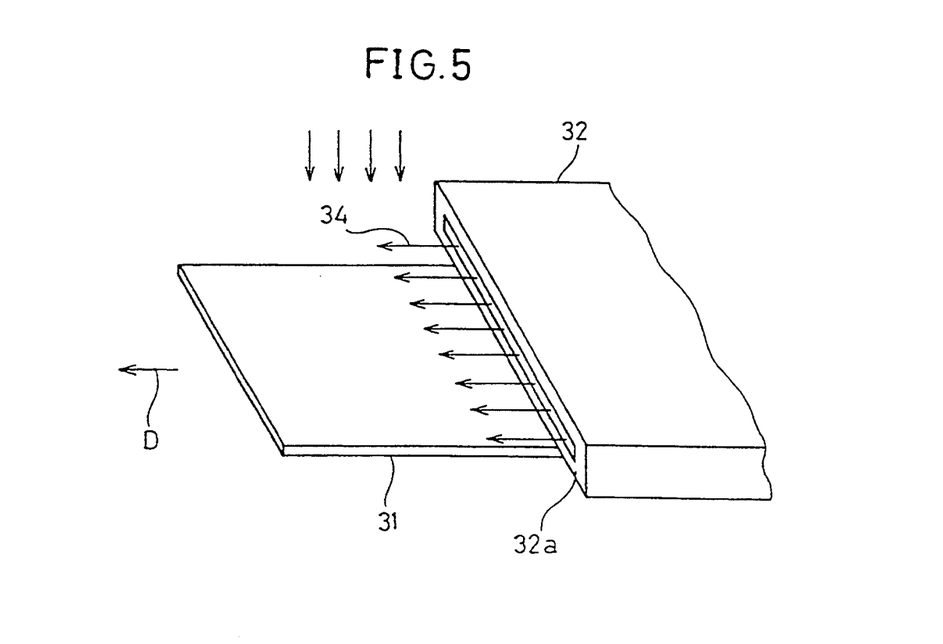
FIG. 5 is a perspective view for illustrating a process of forming a single-crystalline thin film while feeding a gas in a prescribed direction.

According to the present invention, it is possible to supply a portion of a base material, which is released from coverage with a mask and delivered into environment for crystal growth, with a gas flow of the same direction as that of relative movement of the base material by feeding a gas along the said direction. Such a gas flow can be formed by generating the gas from a slit-type hole which is provided on an end of the mask toward the environment for crystal growth, for example. When a gas 34 is fed along a direction (shown by arrow D) of movement of a base material 31 from an end 32a of a mask 32 as shown in FIG. 5, for example, it is possible to grow a crystal having a specific orientation on a region of the base material 31 holding directionality of such a gas flow along this direction. The region holding directionality of the gas flow is conceivably restricted to an extremely narrow range. Once a thin film having a regular orientation is formed on this portion, however, it is possible to form a film along the orientation of the underlying film which is formed along the gas flow even if this film is formed on a region, such as a portion separated from an injection port for the gas, breaking the directionality of the gas flow. Also in a case of forming a thick film, therefore, it is possible to grow a crystal having a specific orientation by regulating its orientation along the underlying film whose orientation is controlled by the gas flow. Thus, the gas flow so serves as to form a crystal nucleus having a specific orientation. When the base material is continuously moved to successively expose the region covered with the mask to the vapor phase, growth of a thin film progresses so that its orientation is regulated along the crystal which is controlled in orientation by the gas flow, as hereinabove described. Thus, it is possible to form a single-crystalline thin film having a regular crystal orientation on the base material. Such formation of a thin film using a gas flow is applicable to a single-crystalline thin film which is formed along a longitudinal direction of a tape-type base material, or a single-crystalline thin film which is formed on an arbitrary region of a base material covered with a mask having a window. In order to form an oxide superconducting thin film, the gas preferably consists essentially of oxygen.

Figure 6:
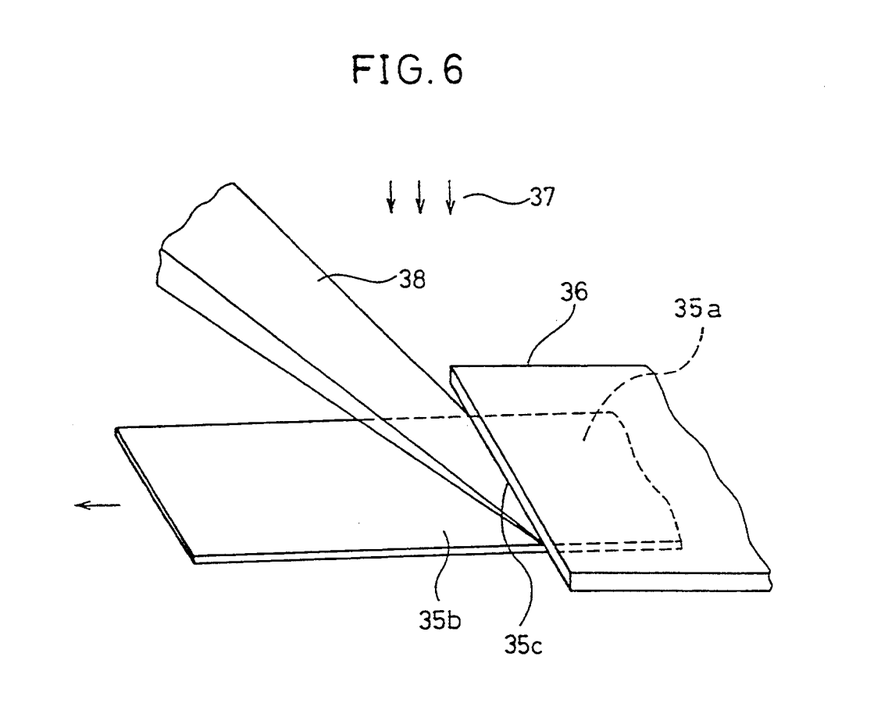
FIG. 6 is a perspective view for illustrating a process of forming a single-crystalline thin film with irradiation of a laser beam or an ion beam.

As hereinabove described, it is possible to further positively control the crystal orientation by using a metal thin film or a gas flow. However, it is rather difficult to stably obtain a proper solid-liquid interface by optimizing temperature distribution on a boundary region, due to slight fluctuation in a distance between a base material and a heating apparatus or the like. Further, specific and fine adjustment of a gas nozzle is required in order to supply the base material with a constant gas flow. The aforementioned technique requires complicated adjustment and operations, with difficulty in maintenance of a proper state for a long time. To this end, the inventors have found a method of using a laser beam or an ion beam as shown in FIG. 6, in order to carry out stable control for a long time. Referring to FIG. 6, a boundary region 35c between a portion 35a of a base material which is covered with a mask 36 and another portion 35b which is exposed to a vapor phase 37 is irradiated with a linearly focused beam 38. This beam 38 is prepared from a linearly focused laser beam or an ion beam having a linear section. Due to irradiation with such a beam, it is possible to relatively easily implement an extremely higher energy state in a boundary region as compared with a peripheral portion. Even if molecules or atoms entering a small clearance between a mask and a base material come into contact with a portion of the base material, being covered with the mask, which is close to a boundary region to form a polycrystalline initial thin film, therefore, such an initial thin film is completely evaporated from the base material or sputtered (worn) at the boundary region when the base material is continuously delivered from the mask. Thus, the surface of the base material is maintained in high purity. Film formation on the base material is first started immediately after the base material is released from irradiation with the laser beam or the ion beam. Consequently, shape steps having excellent reproducibility and a regular crystal orientation are formed on the base material so that an initial growth film is formed along edges of such steps. Since an initial growth film having a specific crystal orientation is reliably formed in the aforementioned manner, it is possible to thereafter grow a film with a dominative crystal orientation also at a position separated from the boundary region. According to this technique, therefore, it is possible to form a thin film having a regular crystal plane orientation on a base material without forming a solid-liquid interface in a boundary region between a mask and a base material and without supplying a gas flow in a direction of relative movement of the base material. The laser beam is preferably prepared from a coherent pulsed laser beam such as an excimer laser beam. The beam source can be selected from ArF, KrF, XeCl and $N_2$ excimer lasers, and a YAG laser. The excimer lasers have specific oscillation wavelengths of 193 nm, 248 nm, 308 nm and 337 nm respectively. As to the YAG laser, it is possible to preferably use second, third and fourth harmonics. When an oxide superconducting film is formed, an excellent result can be obtained by setting an energy density of the pulsed laser beam in a range of at least 0.5 $J/cm^2$ and not more than 5.0 $J/cm^2$ per pulse. The pulsed laser beam can be linearly converged through a cylindrical lens or a cylindrical mirror. On the other hand, an ion beam can be obtained by accelerating and converging ions generated from an ion source with an electrostatic lens system, as is well known in the art. The boundary region of the base material is irradiated with the ion beam having a linear section under conditions required for implementing a high energy state by acceleration of ions and an effect of charges. Dispersion of energy distribution is preferably not more than 5% on a section of the ion beam. An ion source may be prepared from argon, oxygen or a mixture thereof, for example. The energy of the ion beam can be set in a range of 50 to 500 eV, for example. Such irradiation with the beam can be combined with the aforementioned technique of employing a metal thin film or a gas flow.

As described in the following Examples, the present invention is preferably employed for forming a thin film which consists essentially of an oxide superconductor on a flexible long base material. An oxide superconductor film having excellent crystallinity provides a wire having excellent superconductivity. The present invention is also applicable to fabrication of a superconducting element. As to the aforementioned technique employing a beam, expected is application to fabrication of a long wire such as a wire of at least 100 m, for example.

EXAMPLE 1

Figure 7:
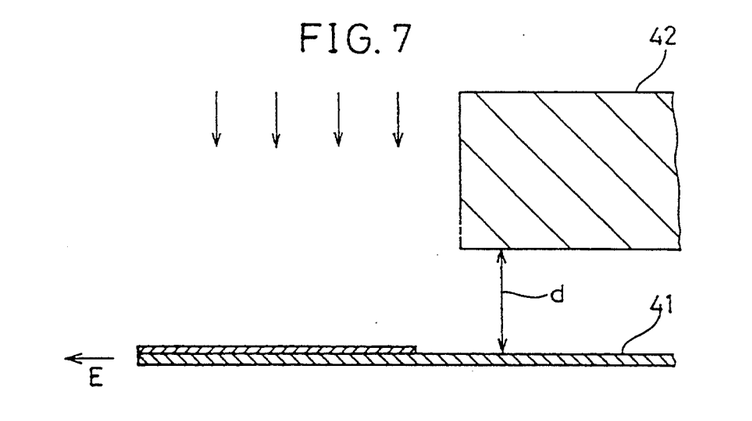
FIG. 7 is a sectional view showing a process of forming a single-crystalline thin film in Example 1 according to the present invention.

An Ni-Cr alloy tape of 0.1 mm in thickness and 5 mm in width was employed as a base material 41, and a mask 42 of stainless steel was fixed on this base material 41 with a clearance d of 0.1 mm as shown in FIG. 7. Reactive vacuum deposition was employed for forming a thin film of yttria stabilized zirconia on the Ni alloy tape. A reaction gas was prepared from oxygen, and its pressure was set at 3 mTorr. The temperature of the base material 41 was set at 750° C. As hereinabove described, the base material 41 was continuously moved along arrow E in FIG. 7 at a speed of 2 mm/min., to form a thin film of yttria stabilized zirconia by vacuum deposition. At this time, a portion of the tape up to 5.2 cm from its front was provided with a non-oriented thin film of yttria stabilized zirconia, while a subsequent portion was provided with a uniaxially oriented film perpendicularly directing its [100] axis to the surface of the base material 41 over a length of 3.8 cm. A further subsequent portion was provided with a thin film of yttria stabilized zirconia strongly orienting [010] and [001] axes in a plane parallel to the base material surface with a regular orientation of these axes within an inclination of 5°. It was confirmed by X-ray diffraction that this orientation (biaxial orientation) was implemented over a length of 3 m. Also as to another length, it was anticipated that a thin film having a strong biaxial orientation, i.e., a single-crystalline thin film, can be obtained so far as conditions for vacuum deposition and continuous movement of the base material are stable and the mask is provided in a fixed manner.

EXAMPLE 2

Figure 8:
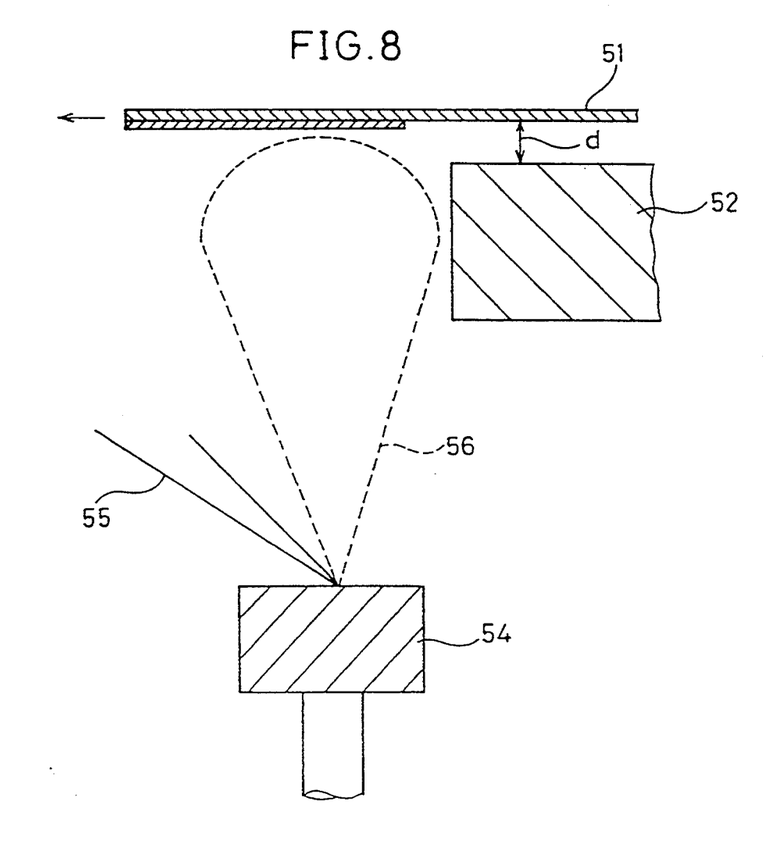
FIG. 8 is a model diagram showing a state of forming a single-crystalline thin film by laser ablation in Example 2 according to the present invention.

The same Ni-Cr alloy tape as that in Example 1 was employed as a base material 51, to form a thin film of yttria stabilized zirconia by laser ablation. The laser ablation was carried out as shown in FIG. 8. A target 54 of a Y sintered body was irradiated with a laser beam 55 to generate a plume 56 shown in FIG. 8 in a direction perpendicular to the target surface, so that chemical species contained in the plume 56 adhered onto the base material 51 which was continuously delivered from above the mask 52. In such laser ablation, the temperature of the base material 51 was set at 650° to 750° C., and gaseous oxygen was set at a pressure of 30 to 500 mTorr. The laser beam 55 was emitted from a KrF excimer laser (wavelength: 248 nm), with a laser energy density of 1.5 to 3.3 $J/cm^2$ and a laser repetition rate of 1 to 100 Hz. A clearance d between the base material 51 and the mask 52 was set at 0.1 mm. Also when such laser ablation was employed, it was possible to form a thin film of yttria stabilized zirconia having strong single-crystallinity over a length of 2 m from a portion of 12.5 cm from the front of the tape-type base material 51.

EXAMPLE 3

The same base material as that in Example 1 was employed to form a thin film of yttria stabilized zirconia through no mask. The as-formed thin film, in which [100] and [111] axes were uprighted with respect to the base material surface in a mixed state, exhibited random axial orientation with respect to the direction in the base material surface. Then, a $Y_1Ba_2Cu_3O_x$ thin film was formed according to the present invention on the thin film of yttria stabilized zirconia formed on the base material through laser ablation shown in FIG. 8. In this laser ablation, gaseous oxygen was set at a pressure of 200 mTorr, the base material was set at a temperature of 700° C., and a film forming rate was set at 1.5 $\mu m/min$. A laser beam was emitted from an excimer laser similarly to Example 2, and the base material was continuously moved at a speed of 18 mm/min., to continuously form the $Y_1Ba_2Cu_3O_x$ thin film. The as-formed thin film was c-axis oriented along the overall tape length, while a and b axes exhibited strong orientation from a portion of 5.6 cm from the tape front and it was confirmed that the orientation of these axes was within 4° over a length of 1.4 m.

EXAMPLE 4

A tape-type base material provided with a thin film of yttria stabilized zirconia having strong single-crystallinity formed in Example 2 was prepared in a length of 1 m. Then, a $Ya_1Ba_2Cu_3O_x$ thin film was formed through a mask by laser ablation similarly to Example 3, under conditions of a base material temperature of 700° C., a gaseous oxygen pressure of 200 mTorr, a film forming rate of 1.5 $\mu m/min$. and a base material moving speed of 18 mm/min. In this case, a c-axis oriented film having strong single-crystallinity was formed from a portion of 8 mm from the tape front. In this film, a crystal axis which was substantially parallel to the base material surface was oriented in a range within 2°. On the other hand, another $Y_1Ba_2Cu_3O_x$ thin film was formed through no mask by laser ablation, for the purpose of comparison. In this case, the orientation of an axis which was substantially parallel to a base material surface was dispersed in excess of 4°. Thus, it was clarified that a thin film having single-crystallinity can be obtained by forming a thin film with a mask.

EXAMPLE 5

While the clearance d between the tape-type base material and the mask was 0.1 mm in Example 4, $Y_1Ba_2Cu_3O_x$ thin films were formed under the same conditions as Example 4 except that values of such clearances d were varied in a range of 0.1 to 5 mm, in order to examine influences exerted by such clearances on the as-formed films. Resultingly obtained were inclinations evaluating orientation of crystal axes which were substantially parallel to base material surfaces for the respective values of the clearances, as shown in Table 1.

TABLE 1

| Clearance (mm) | Inclination (Maximum Value)(°) |
| --- | --- |
| 0.1 | 2 |
| 0.2 | 3 |
| 0.5 | 3 |
| 1.0 | 4 |
| 1.5 | 3 |
| 2.0 | 5 |
| 2.5 | 3 |
| 3.0 | 6 |
| 3.5 | 17 |
| 4.0 | 28 |

As shown in Table 1, it was clarified that a thin film having strong single-crystallinity can be obtained according to this Example so far as the clearance d is not more than 3 mm.

EXAMPLE 6

Base materials were prepared from tapes of an Ni group alloy, called hastelloy, of 0.1 mm in thickness and 5 mm in width, to form thin films of yttria stabilized zirconia and magnesium oxide independently of each other by the laser ablation shown in FIG. 8. In this laser ablation, the base materials were set at temperatures of 650° to 750° C., and gaseous oxygen was set at pressures of 30 to 500 mTorr. Laser beams were emitted from KrF excimer lasers (wavelength: 248 nm), with laser energy densities of 1.5 to 3.3 J/cm$^2$ and laser repetition rates of 1 to 100 Hz. Clearances d between base materials 51 and masks 52 were set at 0.8 mm. According to this Example, speeds of movement of the base materials 51 with respect to the masks 52 were varied in a range of 0.1 to 1.5 cm/min. to form thin films of 0.2 μm in thickness along the overall base materials 51, in order to examine influences exerted by such speeds for moving the base materials 51 on film formation. Further, investigation was made on axial orientation in the as-formed thin films of yttria stabilized zirconia and magnesium oxide. As the result, [100] axes were perpendicularly oriented with respect to the tape base material surfaces and [010] axes were oriented along edges of growth ends of thin film crystals in directions parallel to the base material surfaces in both of the as-formed thin films. In order to compare degrees of orientation of (010) planes in the respective thin films, further, proportions in which mutual inclinations of [010] axes of respective crystal grains in the thin films were within ±5° were obtained as shown in Table 2. As understood from Table 2, it was clarified that excellent orientation can be obtained as to the crystal plane when the speed of movement of a base material with respect to a mask is at least about 1 cm/min. This is conceivably because molecules and atoms contained in a vapor phase hardly enter a small clearance between the mask and the base material when the base material is delivered into the vapor phase at a speed of at least about 1 cm/min., whereby a sharp crystal growth end is reliably formed on a boundary region of the base material.

TABLE 2

| Speed for Moving Tape-Type Base Material (cm/min.) | Yttria Stabilized Zirconia Thin Film (%) | Magnesium Oxide Thin Film (%) |
| --- | --- | --- |
| 0.1 | 75 | 66 |
| 0.3 | 72 | 62 |
| 0.5 | 73 | 68 |
| 0.7 | 88 | 71 |
| 0.9 | 86 | 73 |
| 1.0 | 98 | 91 |
| 1.5 | 99 | 97 |

EXAMPLE 7

Base materials were prepared from tapes of an Ni-group alloy, called hastelloy, of 0.1 mm in thickness and 5 mm in width similarly to Example 6, to first form thin films of yttria stabilized zirconia on the base materials through no masks. The as-formed thin films, in which [100] and [111] axes were uprighted with respect to the base material surfaces in mixed states, exhibited random axial orientation with respect to directions in the base material surfaces. Then, Y$_1$Ba$_2$Cu$_3$O$_x$ thin films were formed according to the present invention on the thin films of yttria stabilized zirconia which were formed on the base materials by the laser ablation shown in FIG. 8. In this laser ablation, the base materials were set at temperatures of 700° C., and gaseous oxygen was set at pressures of 200 mTorr. Laser beams were emitted from KrF excimer lasers (wavelength: 248 nm), with laser energy densities of 1.5 to 3.3 J/cm$^2$ and laser repetition rates of 1 to 100 Hz. Clearances d between such base materials 51 and masks 52 were set at 1.0 mm. According to this Example, speeds for moving the base materials 51 with respect to the masks 52 were varied in a range of 0.1 to 2.0 cm/min. to form thin films of 1.0 μm along the overall base materials 51, in order to examine influences exerted by such speeds for moving the base materials 51 on film formation. Further, investigation was made on crystal orientation in the as-formed Y$_1$Ba$_2$Cu$_3$O$_x$ thin films. As the result, the as-formed thin films, in which c-axes were uprighted with respect to the base material surfaces, exhibited strong orientation of a and b axes along growth ends of thin film crystals. In order to compare degrees of orientation of (010) planes in the thin films, proportions in which inclinations of a axes in the respective crystal grains were within ±5° were obtained as shown in Table 3.

TABLE 3

| Speed for Moving Tape-Type Base Material (cm/min.) | Y$_1$Ba$_2$Cu$_3$O$_x$ Thin Film (%) |
| --- | --- |
| 0.1 | 62 |
| 0.4 | 58 |
| 0.6 | 64 |
| 0.8 | 69 |
| 0.9 | 70 |
| 1.0 | 92 |
| 1.3 | 98 |
| 1.5 | 97 |
| 2.0 | 99 |

As understood from Table 3, it was clarified that the aforementioned proportion is in excess of 90% and a thin film having excellent plane orientation can be obtained when a speed for moving a tape-type base material with respect to a mask is at least about 1 cm/min.

In the aforementioned Examples 6 and 7, it was also confirmed that excellent plane orientation can be implemented when the speed for moving the base material is at least about 1 cm/min., even if the clearance d between the mask and the base material is not set at a value of not more than 3 mm.

EXAMPLE 8

A base material was prepared from an Ni-Cr alloy tape of 0.1 mm in thickness and 5 mm in width, to form a thin film of magnesium oxide on the base material by reactive vacuum deposition in a preparation process similar to that in Example 1. In this case, a magnesium oxide thin film having strong single-crystallinity was formed from a portion of 3.2 cm from the tape front. In the as-formed thin film, a [100] axis was oriented perpendicularly to the tape base material surface, while a [010] axis was unidirectionally oriented in a direction parallel to the base material surface within a range of an angle of 4°. Further, a [001] axis was also oriented substantially at the same degree as the [010] axis.

EXAMPLE 9

A thin film of Bi$_2$Sr$_2$Ca$_2$Cu$_3$O$_x$ was formed on the magnesium oxide thin film prepared in Example 8 by excimer laser ablation. This laser ablation was carried out under conditions of a base material temperature of 720° C., a gaseous oxygen pressure of 110 mTorr, a speed of 1.3 mm/min. for continuously moving the base material, and a film forming rate of 0.18 μm/min. The as-obtained thin film exhibited strong single-crystallinity from a portion of 3.8 cm from the tape front. The crystal forming the thin film oriented its c-axis substantially perpendicularly to the base material surface, while inclinations of a and b axes were within 3.2° along the overall length.

EXAMPLE 10

While the thin films were formed on tape-type base materials in the aforementioned Examples 1 to 9, a single-crystalline thin film was formed on a prescribed region of a base material through a mask having a window as described above in Example 10. The base material was prepared from a sintered body sheet (50 by 50 mm) of yttria stabilized zirconia, and a mask was prepared from a stainless steel mask (150 by 150 mm) provided with a square window of 10 by 10 mm. A clearance between the mask and the base material was set at 0.2 mm under the same film forming conditions as Example 3, and the mask was continuously moved in the manner shown in FIG. 2, to form a $Y_1Ba_2Cu_3O_x$ thin film on the base material surface. It was clarified that a and b axes were oriented with inclinations within 3° in the as-formed film. When another thin film was directly formed on a similar base material with no mask, on the other hand, only a c-axis was oriented in the as-formed film absolutely with no orientation of a and b axes in a constant direction since the zirconia base material was a polycrystalline substance.

EXAMPLE 11

Figure 9:
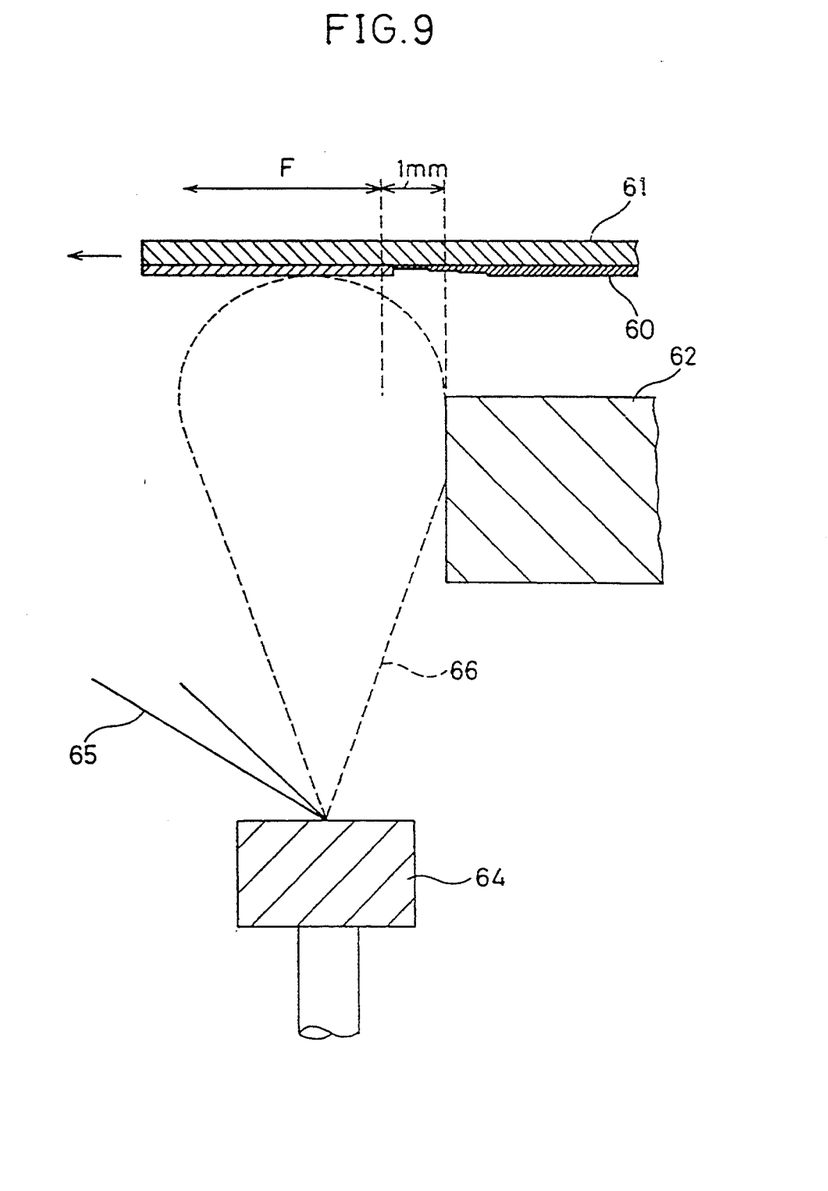
FIG. 9 is a model diagram showing a state of forming a single-crystalline thin film in Example 11 according to the present invention.

A base material 61 was prepared from an Ni-Cr alloy tape of 0.1 mm in thickness and 5 mm in width which was provided thereon with a yttria stabilized zirconia thin film and a silver thin film 60 of 0.3 μm in thickness. A $Y_1Ba_2Cu_3O_x$ thin film was formed on the base material 61 thus provided with the silver thin film 60 by excimer laser ablation, as shown in FIG. 9. In a region where the base material 61 provided the silver thin film 60 was exposed to environment for forming a thin film as shown in FIG. 9, a region (denoted by F in the figure) of the base material 61 up to 1 mm from a front of a mask 62 was maintained at a temperature of 700° C. On the other hand, a temperature gradient of 30° C./mm was set from a portion of 1 mm from the front of the mask 62. In such temperature environment, the silver thin film 60 formed a solid-liquid boundary as described above, while the base material 61 had a step shape, which was similar to that shown in FIG. 4, in a boundary region between a portion which was covered with the mask 62 and that exposed to the environment for forming the thin film. Similarly to Example 2, a target 64 was prepared from a Y sintered body and irradiated with an excimer laser beam 65, to generate a plume 66 and deposit chemical species contained in this plume 66 on the base material 61. A speed for moving the base material 61 was set at 5 mm/min., and a film forming rate was set at 0.41 μm/min. In the as-formed $Y_1Ba_2Cu_3O_x$ film, regulation of a and b axes was started along a certain direction in the base material surface from a portion of 3.5 cm from the tape front, and it was confirmed that inclinations of these axes were within 4° over a length of 2 m.

EXAMPLE 12

Similarly to Example 8, a thin film of magnesium oxide was first formed on an Ni-Cr alloy tape of 0.1 mm in thickness and 5 mm in width. Then, a silver thin film was formed in a thickness of 0.3 μm on the alloy tape provided with the magnesium oxide tape, similarly to Example 11. Then, a thin film of $Bi_2Sr_2Ca_2Cu_3O_x$ was deposited on the magnesium oxide thin film by laser ablation in a process using a mask, similarly to Example 11. In the as-formed $Bi_2Sr_2Ca_2Cu_3O_x$ film, regulation of a and b axes was started in the base material surface from a portion of 4 cm from the tape front, while inclinations of these axes were within 5° over a length of 2 m.

EXAMPLE 13

Figure 10:
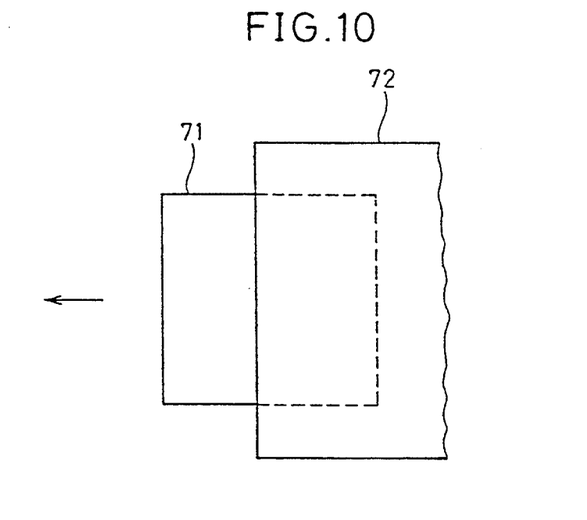
FIG. 10 is a plan view for illustrating a process of forming a single-crystalline thin film in Example 13 according to the present invention.

A sintered substrate (50 by 50 by 0.5 mm in size) 71 of magnesium oxide was employed and moved along arrow from under a mask 72 as shown in FIG. 10, to for a thin film of $Y_1Ba_2Cu_3O_x$. In such formation of the thin film, a silver film of 0.5 μm in thickness was previously formed on the substrate 71. Temperature distribution and a position of the mask 72 with respect to the temperature distribution were set similarly to Example 11. Under film forming and moving conditions similar to those in Example 11, the $Y_1Ba_2Cu_3O_x$ thin film was formed by excimer laser ablation. In the as-obtained thin film, a and b axes were regularized in the substrate surface over the entire surface, and inclinations of these axes within 3°.

EXAMPLE 14

Figure 11:
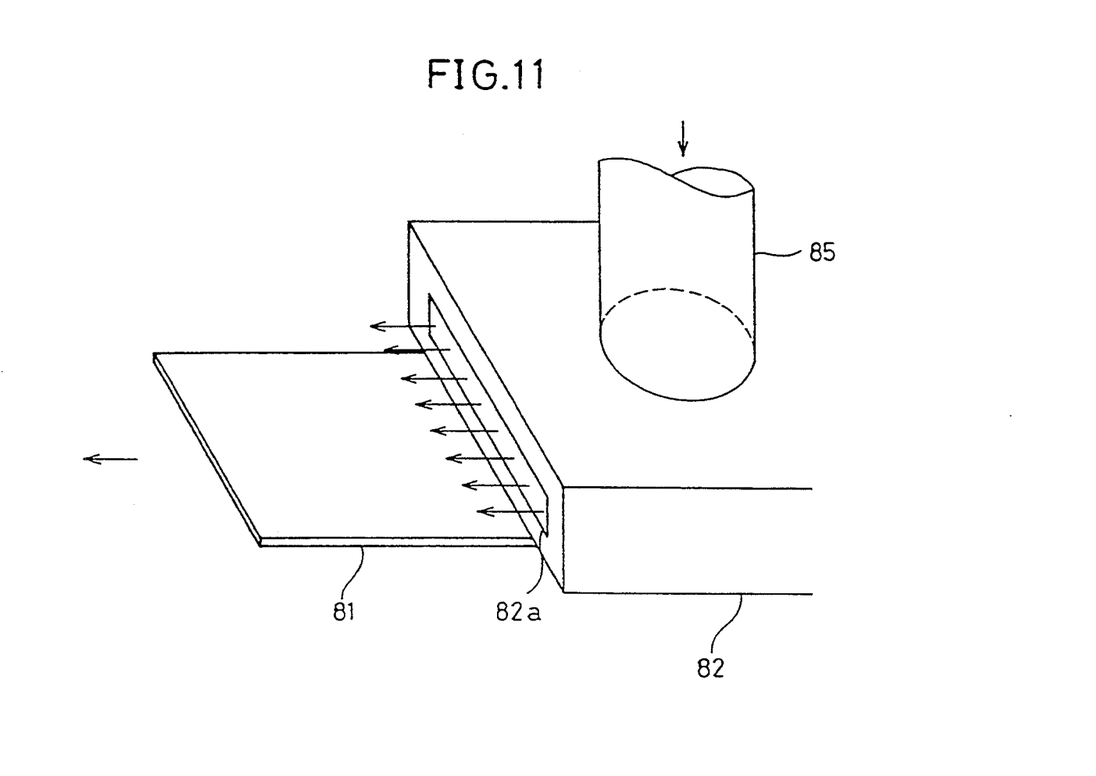
FIG. 11 is a perspective view for illustrating a process of forming a single-crystalline thin film in Example 14 according to the present invention.

As shown in FIG. 11, a mask 82 which was connected with a pipe 85 on its portion and provided with a slit 82a in its front portion was provided on a base material 81 of an Ni-Cr alloy of 0.1 mm in thickness and 10 mm in width. The mask 82 had a hollow interior so that a gas supplied from the pipe 85 was injected from the slit 82a. The slit 82a was 0.2 mm in height, and its width was 10 mm similarly to the tape-type base material 82. The mask 82 having the slit 82a was employed to deposit a yttria stabilized zirconia thin film by vacuum evaporation while continuously moving the base material 81 similarly to the aforementioned Example. In such film formation, gaseous oxygen was fed from the slit 82 at a flow rate of 2 cc/min. in the same direction as that for moving the base material 81. Further, a gas pressure in the film forming chamber was set at 4 mTorr. The base material 81 was set at a temperature of 780° C. and moved along arrow appearing in FIG. 11 at a speed of 4 mm/min., to form a film at a rate of 0.05 μm/min. Obtained as the result was a yttria stabilized zirconia thin film having [001] orientation, which was perpendicular to the tape surface, from a portion of 2.8 cm from the tape front over a length of 1.8 m, with [110] orientation in the gas flow direction on the tape. The yttria stabilized zirconia thin film having such orientation of the axes can be regarded as a single-crystalline thin film.

EXAMPLE 15

The same tape-type base material as Example 14 was employed to previously form a non-oriented yttria stabilized zirconia thin film on the base material with no mask over a length of 1.5 m. Then, a thin film of $Y_1Ba_2Cu_3O_x$ was formed on this thin film in the manner shown in FIG. 11. In such formation of the thin film, the base material was set at a temperature of 700° C., a flow rate of oxygen fed from a slit was set at 20 sccm, and a gas pressure in the film forming chamber was set at 150 mTorr. Further, the film was formed on the tape-type base material at a rate of 2.5 cm/min. by excimer laser ablation. The $Y_1Ba_2Cu_3O_x$ thin film formed under the aforementioned conditions exhibited c-axis orientation to a portion of 25 mm from the tape front, while no a and b axes were oriented in a specific direction. However, a and b axes were regularized along a specific direction of the as-fed gas over a length of 25 mm to 1.475 m, and inclinations of these axes were within 3° along the overall length.

EXAMPLE 16

A thin film of magnesium oxide was formed on an Ni alloy tape, similarly to Example 14. At this time, obtained was a magnesium oxide thin film having [001] orientation, which was perpendicular to the tape surface, over a length of 1.8 m from a portion of 2.8 cm from the tape front and [100] orientation in a gas flow direction.

EXAMPLE 17

The same tape-type base material as Example 14 was employed to form a magnesium oxide thin film having no orientation by ordinary vacuum deposition. Then, a $Bi_2Sr_2Ca_2Cu_3O_x$ thin film was formed on the magnesium oxide thin film under conditions of a base material temperature of 720° C., an oxygen flow rate of 30 sccm and a gas pressure of 110 mTorr by excimer laser ablation, in a similar manner to that shown in FIG. 11. In such formation of a thin film, a speed for moving the tape was set at 1.8 cm/min., and a film forming rate was set at 1.1 μm/min. In the as-formed thin film, a portion up to 3.2 cm from the tape front exhibited c-axis orientation which was perpendicular to the base material surface, while orientation of a and b axes in a tape surface direction was random. However, a portion of the film formed on a region over a length of 1.2 m from a portion of 3.2 cm from the tape front exhibited c-axis orientation with a and b axes regularly oriented along a gas flow direction, at constant inclinations within 4°.

EXAMPLE 18

A polycrystalline magnesium oxide sintered body of 50 by 50 mm was employed as a substrate and covered with a mask provided with a gas nozzle having a slit width of 50 mm, to form a $Y_1Ba_2Cu_3O_x$ thin film by vacuum deposition. The thin film was formed under conditions of a substrate temperature of 700° C., a gaseous oxygen flow rate of 10 sccm, a gas pressure of 10 mTorr, a film forming rate of 0.05 μm/min., and a speed of 0.5 mm/min. for moving the substrate. The as-formed film exhibited strong single-crystallinity, with a, b and c axes regularized in a region of 30 by 50 mm in that of 50 by 50 mm.

EXAMPLE 19

In order to confirm an effect of gaseous oxygen which is fed from a nozzle in a specific direction, experiments were made under the same conditions as Example 15 while unidirectionally feeding gaseous oxygen from a gas nozzle and supplying gaseous oxygen through no such gas nozzle. The experiments were made five times with gaseous oxygen fed in a prescribed direction through a gas nozzle, and five times with gaseous oxygen supplied in an arbitrary direction through no gas nozzle. Table 4 shows the results.

TABLE 4

| | With Gas Nozzle | | | With No Gas Nozzle | |
| --- | --- | --- | --- | --- | --- |
| No. | Inclination of a & b Axes (°) | Critical Current Density ($\times 10^5$ A/cm$^2$) | No. | Inclination of a & b Axes (°) | Critical Current Density ($\times 10^5$ A/cm$^2$) |
| 1 | 3 | 12.8 | 1 | 4.1 | 4.2 |
| 2 | 2.6 | 15.6 | 2 | 4.2 | 5.0 |
| 3 | 2 | 19.7 | 3 | 4 | 3.9 |
| 4 | 2.2 | 20.1 | 4 | 4.6 | 3.6 |
| 5 | 1.8 | 21.4 | 5 | 4.3 | 4.7 |

Comparing the results of the experiments with each other, it is clearly understood that inclinations of a and b axes were reduced when gaseous oxygen was unidirectionally fed through a gas nozzle, to improve single-crystallinity of the as-obtained thin film. Further, it was possible to increase a critical current density by unidirectionally feeding gaseous oxygen to twice to five times as compared with the case of employing no gas nozzle, and a further effect of the gas nozzle flow was confirmed. Referring to Table 4, average orientations of a and b axes substantially coincided with the direction of the gas supplied from the gas nozzle, i.e., the longitudinal direction of the tape, while substantially no correlation was attained between average orientations of a and b axes and the longitudinal direction of the tape when no gas nozzle was employed. Thus, it is possible not only to form a single-crystalline thin film but to control crystal orientations of the single-crystalline thin film by employing a gas flow in a specific direction according to the present invention.

In each of the aforementioned Examples, the base material which is provided with a thin film of a superconductor having strong single-crystallinity can be directly applied to a superconducting wire. While a polycrystalline oxide superconducting material has a serious problem of inhibition of a current by its grain boundaries, a film having strong single-crystallinity has higher current capacity due to a smaller amount of grain boundaries. For example, the superconducting thin films formed in Examples 3, 4 and 9 exhibited critical current densities of $7.8 \times 10^5$ A/cm$^2$, $1.95 \times 10^6$ A/cm$^2$ and $3.9 \times 10^5$ A/cm$^2$ at 77.3 K. respectively. Further, the superconducting thin films formed in Examples 11 and 12 exhibited critical current densities of $1.70 \times 10^6$ A/cm$^2$ and $7.5 \times 10^5$ A/cm$^2$ at 77.3 K. respectively. In addition, the superconducting thin films formed in Examples 15 and 17 exhibited critical current densities of $1.28 \times 10^6$ A/cm$^2$ and $7.9 \times 10^5$ A/cm$^2$ at 77.3 K. respectively. These values are larger by 1 to 2 digits than a critical current density of a polycrystalline superconducting thin film. As shown in Examples 10, 13 and 18, further, it is possible to easily form a single-crystalline thin film on a region having a large area according to the present invention.

EXAMPLE 20

Figure 12:
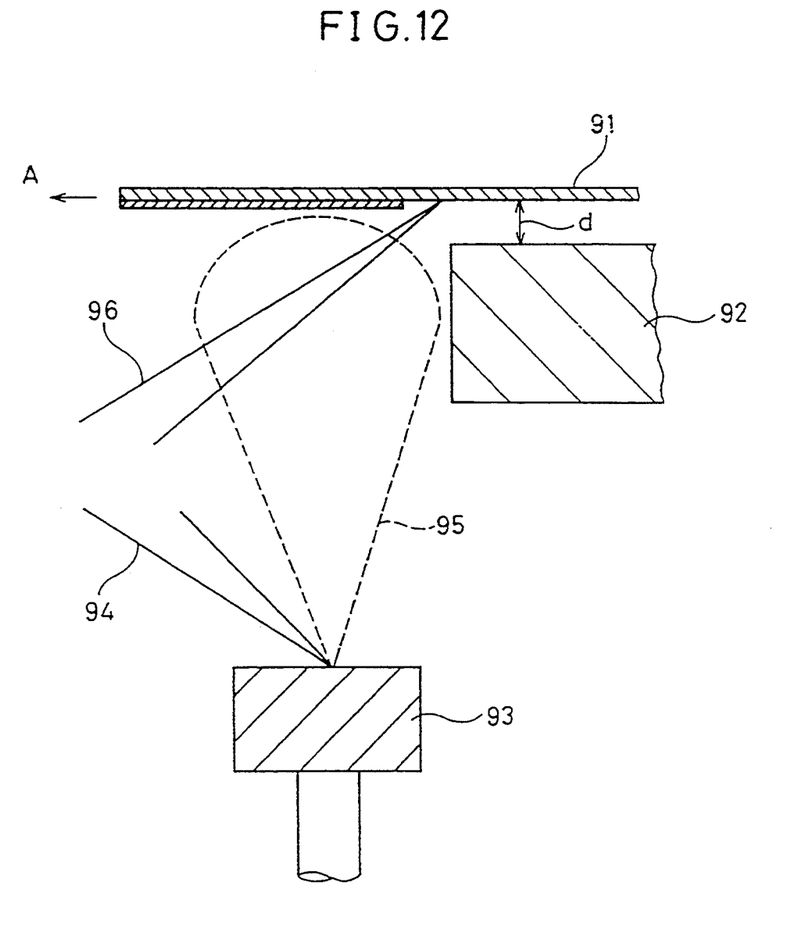
FIG. 12 is a sectional view for typically showing a process of forming a single-crystalline thin film in Example 20 according to the present invention.

A base material 91 was prepared from a tape of an Ni-group alloy, called hastelloy, of 0.1 mm in thickness, 5 mm in width and 1.5 m in length, and first provided thereon with a thin film of yttria stabilized zirconia through no mask. The as-formed thin film, in which [100] and [111] axes were uprighted on the base material surface in a mixed state, exhibited random axial orientation in relation to directions in the base material surface. Then, a boundary region of the tape-type base material 91 between a mask 92 and film forming environment was irradiated with a laser beam 96 which was converged to a beam width of 0.1 mm as shown in FIG. 12, to form a $Y_1Ba_2Cu_3O_x$ thin film on the yttria stabilized zirconia thin film by laser ablation at a film forming rate of 0.45 μm. The laser ablation was carried out as shown in FIG. 12. A Y crystalline target 93 was irradiated with a laser beam 94 to generate a plume 95 perpendicularly to the target surface, so that chemical species contained in this plume 95 adhered onto the tape-type base material 91 which was continuously delivered from above the mask 92. In this laser ablation, the base material 91 was set at a temperature of 650° to 750° C., and gaseous oxygen was set at a pressure of 30 to 500 mTorr. The laser beam 94 was emitted from a KrF excimer laser (wavelength: 248 nm), with a laser energy density of 1.5 to 3.3 J/cm$^2$ and a laser repetition rate of 1 to 100 Hz. A clearance d between the tape-type base material 91 and the mask 92, which was provided in parallel with the base material surface, was set at 1 cm. On the other hand, the laser beam 96 was emitted from a KrF excimer laser (wavelength: 248 nm), with a laser energy density of 1.2 J/cm$^2$ and a laser repetition rate of 10 Hz. The tape-type base material 91 was moved with respect to the mask 92 along arrow A at a speed of 1.2 cm/min., to form the thin film. The as-formed thin film exhibited orientation of a c-axis perpendicularly directed to the base material surface along the overall base material 91. A plane which was parallel to the base material 91 exhibited such a tendency that a and b axes were oriented along the boundary region. Axis orientation of this film was examined in a direction which was parallel to a substrate surface by an X-ray pole figure method, to confirm that crystal grains having axis orientation within ±10° occupied 97% and those having axis orientation within ±5° occupied 91%.

EXAMPLE 21

A $Y_1Ba_2Cu_3O_x$ thin film was formed on a base material by laser ablation, similarly to Example 20. According to this Example, a boundary region of the base material between a mask and film forming environment was irradiated with a laser beam emitted from an ArF excimer laser (wavelength: 193 nm), with a laser energy density of 2 J/cm$^2$ and a laser repetition rate of 100 Hz, which was identical to the frequency of the laser employed in the ablation. Also when such an ArF excimer laser was employed, a and b axes were strongly oriented in a specific direction along the boundary region which was irradiated with the laser beam in a plane parallel to the base material. Orientation of this film in a base material plane direction was examined by an X-ray pole figure method, to confirm that crystal grains having axial orientation within ±10° occupied 95% and those having axial orientation within ±5° occupied 86%.

EXAMPLE 22

$Y_1Ba_2Cu_3O_x$ thin films were formed on base materials by laser ablation, similarly to Example 1. According to this Example, boundary regions were irradiated with ion beams, in place of laser beams. Ion beam sources were prepared from argon gas, gaseous oxygen and a mixed gas containing 50% of argon and 50% of oxygen, with ion beam energy of 350 eV, ion currents of 40 mA, and ion beam irradiation widths of 0.3 mm. All of the as-formed thin films were c-axis oriented along the overall base materials, with such tendencies that a and b axes were strongly oriented in specific directions in directions parallel to the base material surfaces. Axial orientation states in planes which were parallel to the base materials were examined by an X-ray pole figure method, to obtain results shown in Table 5.

TABLE 5

| Ionic Species | Crystal Grains Within Inclination of ±10% | Crystal Grains Within Inclination of ±5% |
|---|---|---|
| Argon (Ar$^+$) | 88% | 78% |
| Oxygen (O$^+$) | 93% | 88% |
| Mixed Gas of Argon & Oxygen (Ar$^+$O$^+$) | 90% | 82% |

It was clarified that a and b axes were oriented at inclinations of substantially within 5° in the as-formed thin films whatever ionic species were employed. It was further confirmed that a thin film having strong single-crystallinity can be obtained also by irradiation with an ion beam having a linear beam section.

In each of the aforementioned Examples, the base material provided with a superconducting thin film having strong single-crystallinity can be directly applied to a superconducting wire. Such a superconducting thin film having strong single-crystallinity can be provided with higher current capacity, due to a smaller amount of grain boundaries. In Examples 20 and 21, for example, wires obtained by forming thin films of superconductors on base materials exhibited critical current densities of $1.2 \times 10^6$ A/cm$^2$ and $8.5 \times 10^5$ A/cm$^2$ at 77.3 K. respectively. In Example 22, further, wires obtained by forming thin films of superconductors on base materials through irradiation with beams of three types of ionic species exhibited critical current densities of $5.3 \times 10^5$ A/cm$^2$ $7.6 \times 10^5$ A/cm$^2$ and $6.8 \times 10^5$ A/cm$^2$ at 77.3 K. respectively. These values are greater by 1 to 2 digits than that of a wire provided with a polycrystalline superconducting thin film.

According to the present invention, as hereinabove described, it is possible to form a thin film having strong single-crystallinity on a region of a base material without depending on a material for and crystallinity a base material. According to the present invention, it is possible to form such a single-crystalline thin film on a base material having a desired shape at a low cost, in place of a conventional single-crystalline substrate. Due to the aforementioned properties, the present invention is extremely useful as a method of forming a thin film as to a Y, Bi or Tl oxide high temperature superconductor. When a superconductor thin film having strong single-crystallinity is formed on a tape-type metal base material according to the present invention, for example, it is possible to obtain a superconducting wire which exhibits a high critical current density, as hereinabove described. According to the present invention, further, a single-crystalline thin film can be easily formed on an arbitrary region of a base material, particularly that having a large area, whereby it is possible to easily obtain a thin film which is effectively applied to a magnetic shield or a high-frequency component. In addition, the present invention is effective for formation of a thin film of a superconducting device using Josephson coupling, for example. According to the present invention, it is possible to form a single-crystalline thin film on a tape-type base material or a wafer having a large area, for example. As hereinabove described, it is possible to form a single-crystalline thin film of a superconductor on an arbitrary region of a base material or a region of the base material having a larger area according to the present invention, whereby superconducting devices can be efficiently mass-produced when a base material provided with a superconductor thin film according to the present invention is cut to obtain chips.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for forming a single-crystalline thin film on a continuous region of a base material from a vapor phase, said method comprising the following sequence of steps:
   preparing a vapor phase of source material;
   preparing said base material having said continuous region;
   covering said base material with a mask wherein said mask is used to prevent adhesion of chemical species of said vapor phase to said base material; and
   moving said base material with respect to said mask so that a portion of said continuous region of said base material is continuously uncovered from said mask and delivered into said vapor phase for depositing said single-crystalline thin film on said continuous region of said base material.

2. A method for forming a single-crystalline thin film in accordance with claim 1, wherein said continuous region of said base material comprises a polycrystalline substance.

3. A method for forming a single-crystalline thin film in accordance with claim 1, wherein said step of preparing said base material further comprises:
   depositing a metal thin film on said continuous region of said base material; and
   providing a temperature gradient between a portion of said base material covered with said mask and that exposed to said vapor phase so that said metal thin film forms a solid-liquid boundary.

4. A method for forming a single-crystalline thin film in accordance with claim 1, wherein the portion of said base material being delivered into said vapor phase from said mask is supplied with a gas flow along a direction substantially identical to that for moving said base material with respect to said mask.

5. A method for forming a single-crystalline thin film in accordance with claim 1, further comprising a step of irradiating a boundary region between a portion of said base material being covered with said mask and that being exposed to said vapor phase with a linearly focused laser beam.

6. A method for forming a single-crystalline thin film in accordance with claim 1 further comprising a step of irradiating a boundary region between a portion of said material being covered with said mask and that being exposed to said vapor phase with an ion beam having a linear beam section.

7. A method for forming a single-crystalline thin film in accordance with claim 1, wherein said vapor phase is prepared by laser ablation.

8. A method for forming a single-crystalline thin film in accordance with claim 1, wherein said base material is exposed to said vapor phase through a window provided in said mask.

9. A method for forming a single-crystalline oxide superconducting thin film on a continuous region of a base material from a vapor phase, said method comprising the following sequence of steps:
   preparing a vapor phase of source material;
   preparing said base material having said continuous region;
   covering said base material with a mask wherein said mask is used to prevent adhesion of chemical species of said vapor phase to said base material; and
   moving said base material with respect to said mask so that a portion of said continuous region of said base material is continuously uncovered from said mask and delivered into said vapor phase for depositing said single-crystalline oxide superconducting thin film on said continuous region of said base material.

10. A method for forming a single-crystalline oxide superconducting thin film in accordance with claim 9, wherein said continuous region of said base material comprises a polycrystalline substance.

11. A method for forming a single-crystalline oxide superconducting thin film in accordance with claim 9, wherein said step of preparing said base material further comprises:
    depositing a metal thin film on said continuous region of said base material; and
    providing a temperature gradient between a portion of said base material covered with said mask and that exposed to said vapor phase so that said metal thin film forms a solid-liquid boundary.

12. A method for forming a single-crystalline oxide superconducting thin film in accordance with claim 11, wherein said metal thin film consists essentially of silver.

13. A method for forming a single-crystalline oxide superconducting thin film in accordance with claim 9, wherein said portion of said base material being delivered into said vapor phase from said mask is supplied with a gas flow along a direction substantially identical to that for moving said base material with respect to said mask.

14. A method for forming a single-crystalline oxide superconducting thin film in accordance with claim 13, wherein said gas consists essentially of oxygen.

15. A method for forming a single-crystalline oxide superconducting thin film in accordance with claim 9, further comprising a step of irradiating a boundary region between a portion of said base material being covered with said mask and that being exposed to said vapor phase with a linearly focused laser beam.

16. A method in accordance with claim 9, further comprising a step of irradiating a boundary region between a portion of said base material being covered with said mask and that being exposed to said vapor phase with an ion beam having a linear beam section.

17. A method in accordance with claim 9, wherein said base material is exposed to said vapor phase through a window provided in said mask.

18. A method in accordance with claim 9, wherein said vapor phase is prepared by laser ablation.

19. A method in accordance with claim 18, wherein said portion of said base material is delivered into said vapor phase at a speed of at least about 1 cm/min.

20. A method in accordance with claim 18, wherein a distance between said base material and said mask is not more than 3 mm.

21. A method in accordance with claim 9 or 18, wherein said base material is a long tape for forming an oxide superconductor wire.

22. A method in accordance with claim 9 or 18, wherein said oxide superconductor is selected from the group consisting of yttrium-based, bismuth-based, and thallium-based oxide superconductors.

23. A method in accordance with claim 18, wherein said oxide superconductor film is formed on a film being formed on said base material and consisting essentially of yttria stabilized zirconia or magnesium oxide.

* * * * *